United States Patent [19]
Kanoh

[11] Patent Number: 5,008,676
[45] Date of Patent: Apr. 16, 1991

[54] DIGITAL/ANALOG CONVERTER

[75] Inventor: Kenji Kanoh, Itami, Japan

[73] Assignee: Mitsubishi Denki Kabushiki Kaisha, Tokyo, Japan

[21] Appl. No.: 551,994

[22] Filed: Jul. 12, 1990

[30] Foreign Application Priority Data

Feb. 15, 1990 [JP] Japan .................................. 2-34677

[51] Int. Cl.⁵ .......................................... H03M 1/78
[52] U.S. Cl. ..................................... 341/154; 341/118
[58] Field of Search ............. 341/154, 118, 144, 153, 341/145; 333/124

[56] References Cited

U.S. PATENT DOCUMENTS

| | | | |
|---|---|---|---|
| 3,755,807 | 8/1973 | Brown | 341/136 |
| 4,580,131 | 4/1986 | Seiler | 341/154 |
| 4,631,518 | 12/1986 | Caspell | 341/122 |
| 4,783,643 | 11/1988 | Dingwall | 341/154 |
| 4,833,473 | 5/1989 | Dingwall | 341/154 |
| 4,843,394 | 6/1989 | Linz et al. | 341/154 |

Primary Examiner—William M. Shoop, Jr.
Assistant Examiner—Brian K. Young
Attorney, Agent, or Firm—Oblon, Spivak, McClelland, Maier & Neustadt

[57] ABSTRACT

The present invention is a digital/analog converter which converts a digital signal of a binary number consisting of $N_L$ low-order bits and $N_U$ high-order bits into an analog signal, in which a first digital/analog converting circit driven in accordance with a digital data of low-order bits employs, as conventional, an R-2R system while a second digital/analog converting circuit driven in accordance with a digital data of high-order bits employs a 2R system. As a result, the influence of an error included in the variation in an output of the analog signal which is caused by the variation in the digital data for the least significant bit can be decreased, whereby a high resolution is obtained, keeping a monotonicity, without a high matching of registors.

4 Claims, 9 Drawing Sheets

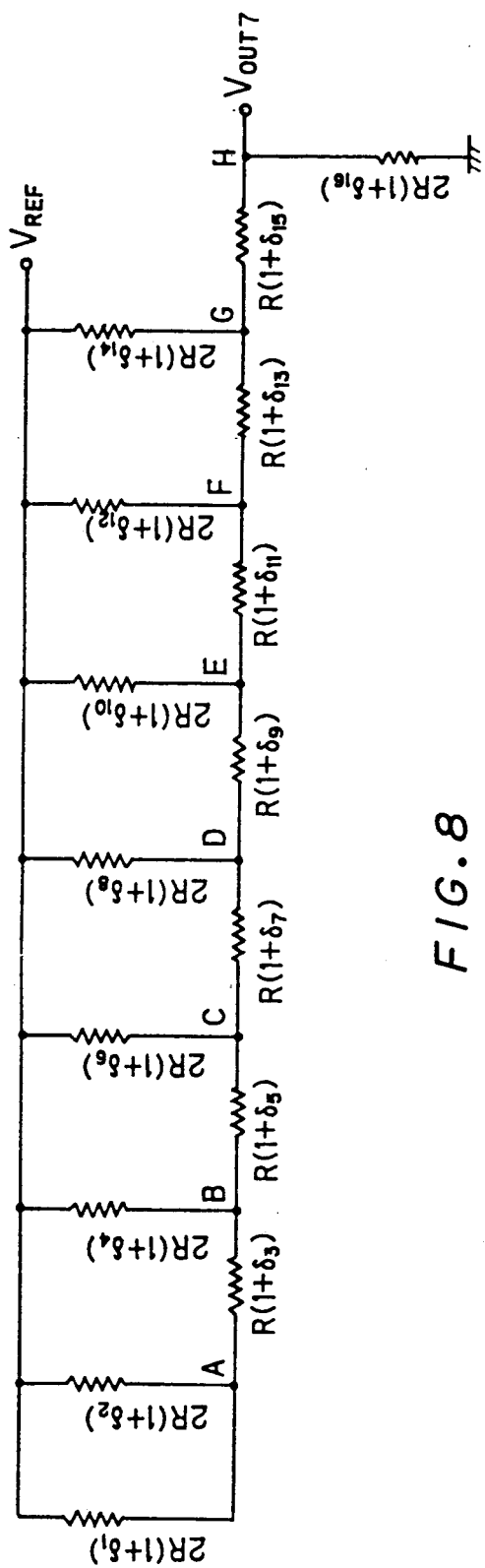
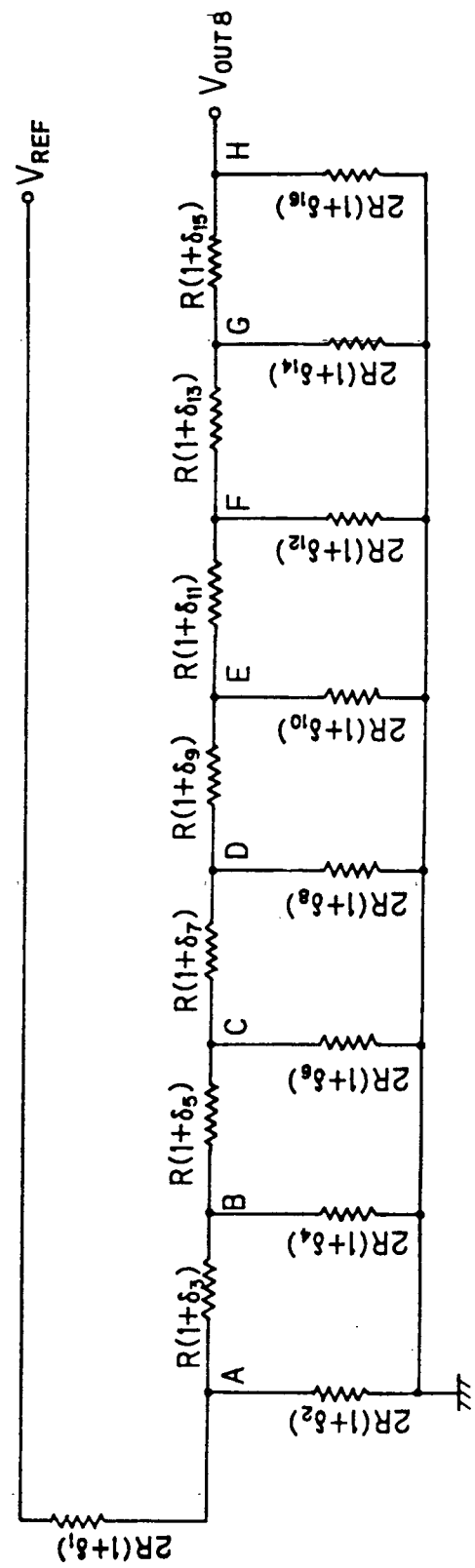
FIG. 7
FIG. 8

DIGITAL/ANALOG CONVERTER

BACKGROUND OF THE INVENTION

1. Field of the Invention

The present invention relates to a digital/analog converter converting a digital signal of a binary number into an analog signal.

2. Prior Art

As an applied-voltage digital/analog converter, that which employs an R-2R system is conventionally known. FIG. 11 shows an 8-bit digital/analog converter employing such an R-2R system.

As shown in FIG. 11, the digital/analog converter is provided with eight changeover switches $S_0$ to $S_7$ corresponding to a bit in each order of an 8-bit digital signal to be D/A-converted. One of contact points of each of the changeover switches $S_0$ to $S_7$ is connected with a first input terminal 1 to which reference voltage $V_{REF}$ is applied, while the other is connected to a second input terminal 2 to which ground potential GND is applied. Between the second input terminal 2 and an output terminal 3, a single resistor which has a resistance value 2R and seven resistors each of which has a resistance value R are connected in series. Between respective nodes between the above-mentioned resistors and respective common contact points of the changeover switches $S_0$ to $S_7$, eight resistors each of which has a resistance value 2R are connected, respectively.

With the digital/analog converter, the changeover switches $S_0$ to $S_7$ change their respective connections between the respective first contact points to which the reference voltage $V_{REF}$ is applied and the respective second contact points to which the ground potential GND is applied depending upon a state of a corresponding bit of a digital signal, and an analog signal having a voltage value corresponding to the digital signal is outputted from the output terminal 3.

In this way, the digital/analog converter employing the conventional R-2R system do not have to have a large number of elements such as the resistors, the changeover switches $S_0$ to $S_7$ and so on, and thus this type of digital/analog converter has the advantage that it can be controlled in a simple way. However, it also has the disadvantage as mentioned below: Practically, the resistors have slightly different resistance values from their desirable resistance values R or 2R, and an error arises in a variation in an output of the analog signal corresponding to a variation in a digital data. With the conventional digital/analog converter, an error included in the variation in an output of an analog signal which is caused by the variation in the digital data for the least significant bit exerts a large influence on the performance of the digital/analog converter, and therefore, it is necessary to accomplish a very high matching of resistors to obtain a converter which has a high resolution, keeping a monotonicity that the analog value of the analog signal monotonously increase or decrease in accordance with the monotonous change of the digital value of the digital signal.

SUMMARY OF THE INVENTION

The present invention is a digital/analog converter which converts a digital signal of a binary number consisting of the $N_L$ low-order bits and the $N_U$ high-order bits into an analog signal, comprising a first input terminal to which first reference potential is applied, a second input terminal to which second reference potential is applied, an output terminal, a first digital/analog converting circuit driven in accordance with a digital data of the low-order bits and a second digital/analog converting circuit driven in accordance with a digital data of the high-order bits.

The first digital/analog converting circuit consists of a first resistor, R-2R circuitry and a first switch group. Specifically, the first resistor has a resistance value 2R and has its one end connected to the second input terminal. The R-2R circuitry has $N_L$ second resistors of resistance value R connected in series and $N_L$ third resistors of resistance value 2R having their respective one ends connected to one ends of the second resistors. A junction of the one end of the second resistor and the one end of the third resistor disposed on one side is connected to the other end of the first resistor, while the other end of the second resistor disposed on the other side is connected to the output terminal. The first switch group consists of $N_L$ first changeover switches each of which has first and second changeover contact points and a common contact point. Each of the first changeover switches has its first changeover contact point connected to the first input terminal, its second changeover contact point connected to the second input terminal and its common contact point connected to the other end of the corresponding third resistor, respectively, and each of the first changeover switches change the connection between the first and second changeover contact points in accordance with a state of each bit of the low-order bits.

On the other hand, the second digital/analog converting circuit consists of 2R circuitry and a second switch group. The 2R circuitry consists of $(2^N-1)$ fourth resistors each of which has a resistance value of 2R and which have their respective one ends commonly connected, and one end of each of the fourth resistors is connected to the output terminal. The second switch group consists of $(2^N-1)$ second changeover switches each of which has first and second changeover contact point and a common contact point. Each of the second changeover switches has its respective first changeover contact point connected to the first input terminal, the second changeover contact point connected to the second input terminal and the common contact point connected to the other end of each of the fourth corresponding resistor, respectively, and the number of the second changeover switches changing their respective connections to the first changeover contact points is determined in accordance with a state of the high-order bits.

Accordingly, it is a major object of the present invention to provide a digital/analog converter which has a high resolution, keeping a monotonicity, without high matching of resistors.

With the digital/analog converter according to the present invention, the first digital/analog converting circuit driven in accordance with the digital data of the low-order bits is formed employing the R-2R system as usual, while the second digital/analog converting circuit driven in accordance with the digital data of the high-order bits is formed employing the 2R system, whereby the influence of an error included in the variation in an output of an analog signal which is caused by the variation in the digital data for the least significant bit can be decreased. Thus, a high resolution can be attained keeping a monotonicity, without a high matching of registors.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5 to 8 are circuit diagrams for calculating amounts of a variation in output voltage, respectively;

DETAILED DESCRIPTION OF THE PREFERRED EMBODIMENT

Figure 1:
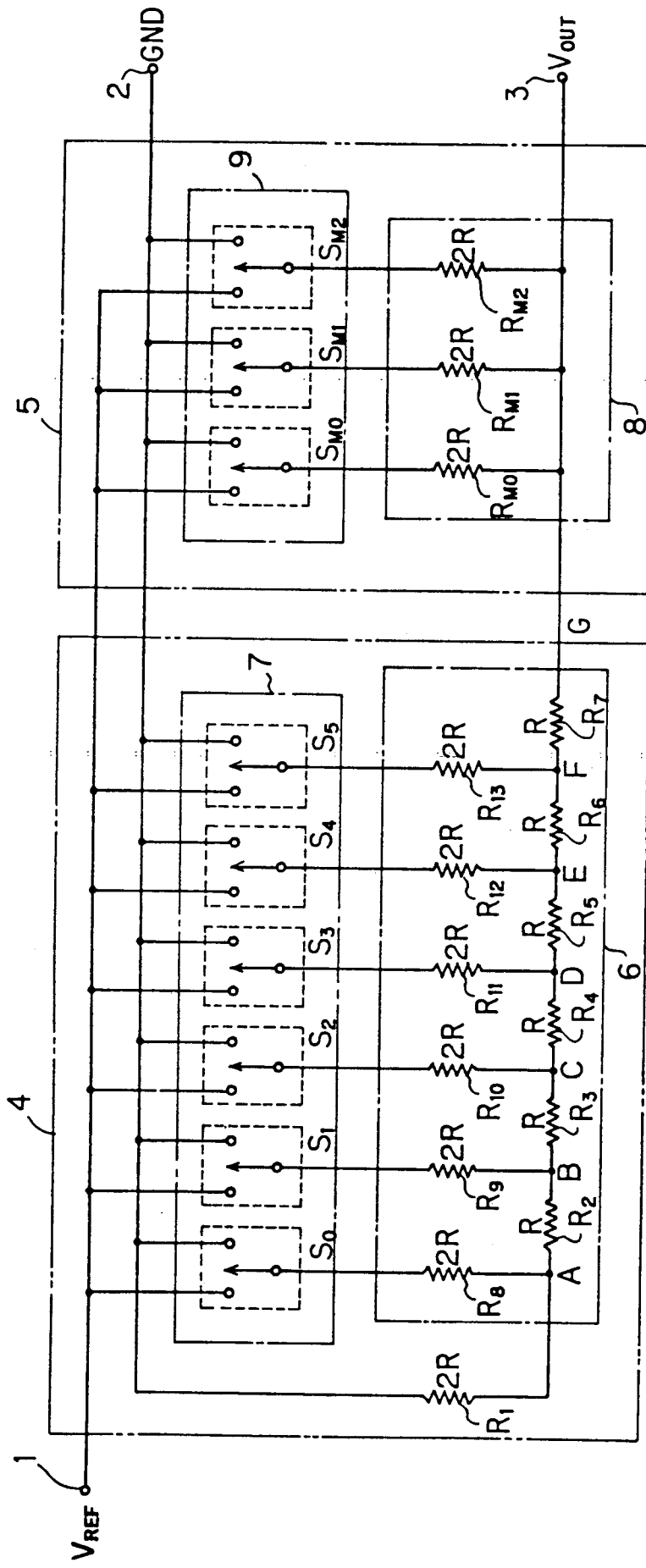
FIG. 1 is a circuit diagram showing an embodiment of an 8 bit digital/analog converter according to the present invention.

FIG. 1 is an embodiment of an 8 bit digital/analog converter according to the present invention.

The digital/analog converter converts a digital signal of a binary number of 6 low-order bits and 2 high-order bits into an analog signal, and is provided with a first digital/analog converting circuit 4 driven in accordance with a digital data of the 6 low-order bits and a second digital/analog converting circuit 5 driven in accordance with a digital data of the 2 high-order bits.

The first digital/analog converting circuit 4 is provided with six changeover switches $S_0$ to $S_5$ changing their respective connections in accordance with a state of the digital data of the 6 low-order bits. One of changeover contact points of each of the changeover switches $S_0$ to $S_5$ is connected with a first input terminal 1 to which reference voltage $V_{REF}$ is applied, while the other thereof is connected to a second input terminal 2 to which ground potential GND is applied. A single resistance $R_1$ having a resistance value 2R and six resistances $R_2$ to $R_7$ each of which has a resistance value R are connected in series between the second input terminal 2 and an output terminal 3. Furthermore, six resistances $R_8$ to $R_{13}$ each of which has a resistance value 2R are connected between one ends of the resistances $R_2$ to $R_7$ and the common contact points of the changeover switches $S_0$ to $S_5$. Thus, an R-2R circuit 6 is composed of the resistances $R_2$ to $R_{13}$, while a first switch group 7 is composed of the changeover switches $S_0$ to $S_5$.

On the other hand, the second digital/analog converting circuit 5 is provided with three changeover switches $S_{M0}$, $S_{M1}$, $S_{M2}$ which change their respective connections in accordance with a state of the digital data of the 2 high-order bits. One of changeover contact points of each of the changeover switches $S_{M0}$, $S_{M1}$, $S_{M2}$ is connected to the first input terminal 1 to which the reference voltage $V_{REF}$ is applied, while the other thereof is connected to the second input terminal GND to which the ground potential GND is applied. Furthermore, three resistances $R_{M0}$, $R_{M1}$, $R_{M2}$ each of which has a resistance value 2R are connected between the common contact points of the changeover switches $S_{M0}$, $S_{M1}$, $S_{M2}$ and the output terminal 3, respectively. Thus, a 2R circuit 8 is composed of the resistances $R_{M0}$, $R_{M1}$, $R_{M2}$, while a second switch group 9 is composed of the changeover switches $S_{M0}$, $S_{M1}$, $S_{M2}$.

The changeover switches $S_0$ to $S_5$ of the first switch group 7 change their respective connections to the reference voltage $V_{REF}$ when a bit corresponding to each of the 6 low-order bits is "1", while they are connected to the ground potential GND when it is "0". The changeover switches $S_{M0}$, $S_{M1}$, $S_{M2}$ of the second switch group 9 change their respective connections in accordance with a state of the 2 high-order bits as shown in a table below.

| $B_6$ | $B_7$ | $S_{M0}$ | $S_{M1}$ | $S_{M2}$ |
|---|---|---|---|---|
| 0 | 0 | GND | GND | GND |
| 1 | 0 | $V_{REF}$ | GND | GND |
| 0 | 1 | $V_{REF}$ | $V_{REF}$ | GND |
| 1 | 1 | $V_{REF}$ | $V_{REF}$ | $V_{REF}$ |

In the table, $B_7$ represents the most significant bit, while $B_6$ represents the second most significant bit. GND represents the changeover switches $S_{M0}$, $S_{M1}$, $S_{M2}$ change their respective connections to the ground potential GND, while $V_{REF}$ represents they change their respective connections to the reference voltage $V_{REF}$.

A function of the digital/analog converter will be explained, comparing with a conventional digital/analog converter shown in FIG. 11.

Now, in the digital/analog converter shown in FIG. 11, a case where the changeover switch, for example, $S_3$ changes its connection to the reference voltage $V_{REF}$ while other changeover switches $S_0$ to $S_2$ and $S_4$ to $S_7$ change their respective connections to the ground potential GND will be discussed. In this case, since a combined resistance on the left of a point C in FIG. 11 is R, a combined resistance on the left of a point D is 2R. Also, a resistance on a part above a point D is 2R. Thus, a combined resistance of both on the left of and above the point D is R. As a result, the voltage at the point D is found to be ½ of the voltage at a point E. This relation covers all the cases related to all points A to H in FIG. 11.

Thus, an output voltage $V_{OUT}$ of the analog/digital converter can be generally expressed by an equation as follows:

$$V_{OUT} = \frac{V_{REF}}{2^8} (b_0 + 2 \cdot b_1 + 2^2 \cdot b_2 + 2^3 \cdot b_3 + 2^4 \cdot b_4 + \quad (1)$$

$$2^5 \cdot b_5 + 2^6 \cdot b_6 + 2^7 \cdot b_7)$$

"$b_0$" to "$b_7$" are numbers that are "1"s when the changeover switches $S_0$ to $S_7$ are connected to the reference voltage $V_{REF}$ but are "0"s when they are connected to the ground potential GND.

Thus, the changeover switches $S_0$ to $S_7$ change their respective connections in accordance with a state of corresponding bits of the digital signal, whereby the 8 bit digital/analog converter is implemented.

Figure 2:
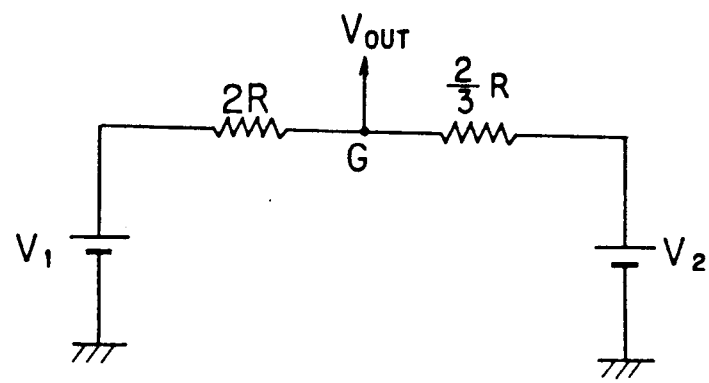
FIG. 2 is an equivalent circuit diagram to FIG. 1.

On the other hand, a digital/analog converter of an embodiment of the present invention, shown in FIG. 1, can also be drawn as in FIG. 2. In FIG. 2, $V_1$ denotes a voltage on the left of a point G of FIG. 1, while $V_2$ denotes a voltage on the right of the point G.

The voltage $V_1$ can be obtained in a way similar to $V_{OUT}$ in the equation (1) and be expressed by an equation as follows:

$$V_1 = \frac{V_{REF}}{2^6} (b_0 + 2 \cdot b_1 + 2^2 \cdot b_2 + 2^3 \cdot b_3 + 2^4 \cdot b_4 + 2^5 \cdot b_5) \quad (2)$$

The voltage $V_2$ can be expressed by an equation as follows:

$$V_2 = \frac{b_{M0} + b_{M1} + b_{M2}}{3} \cdot V_{REF} \quad (3)$$

where $b_{M0}$, $b_{M1}$, $b_{M2}$ are numbers that are "1"s when the changeover switches $S_{M0}$, $S_{M1}$, $S_{M2}$ are connected to the reference voltage $V_{REF}$ but are "0"s when they are connected to the ground potential GND.

Thus, the output voltage $V_{OUT}$ is expressed, using the Thevenin's theorem, by an equation as follows:

$$V_{OUT} = \frac{2R \cdot V_2 + \frac{8}{3} R \cdot V_1}{2R + \frac{8}{3} R} = \frac{3V_2 + V_1}{4} \quad (4)$$

When the expressions (2), (3) are substituted for $V_1$ and $V_2$ in the equation (4), an equation is obtained as follows:

$$V_{OUT} = \frac{V_{REF}}{2^8} \{b_0 + 2 \cdot b_1 + 2^2 \cdot b_2 + 2^3 \cdot b_3 + \quad (5)$$

$$2^4 \cdot b_4 + 2^5 \cdot b_5 + 2^6 (b_{M0} + b_{M1} + b_{M2})\}$$

"$b_6$ and $b_7$" in the equation (1) and "$b_{M0}$, $b_{M1}$, $b_{M2}$" in the equation (5) are related as in the table below:

| $b_6$ | $b_7$ | $b_{M0}$ | $b_{M1}$ | $b_{M2}$ |
|---|---|---|---|---|
| 0 | 0 | 0 | 0 | 0 |
| 1 | 0 | 1 | 0 | 0 |
| 0 | 1 | 1 | 1 | 0 |
| 1 | 1 | 1 | 1 | 1 |

The relation is expressed with an equation as follows:

$$2^6 \cdot b_6 + 2^7 \cdot b_7 = 2^6 \cdot (b_{M0} + b_{M1} + b_{M2})$$

Figure 3:
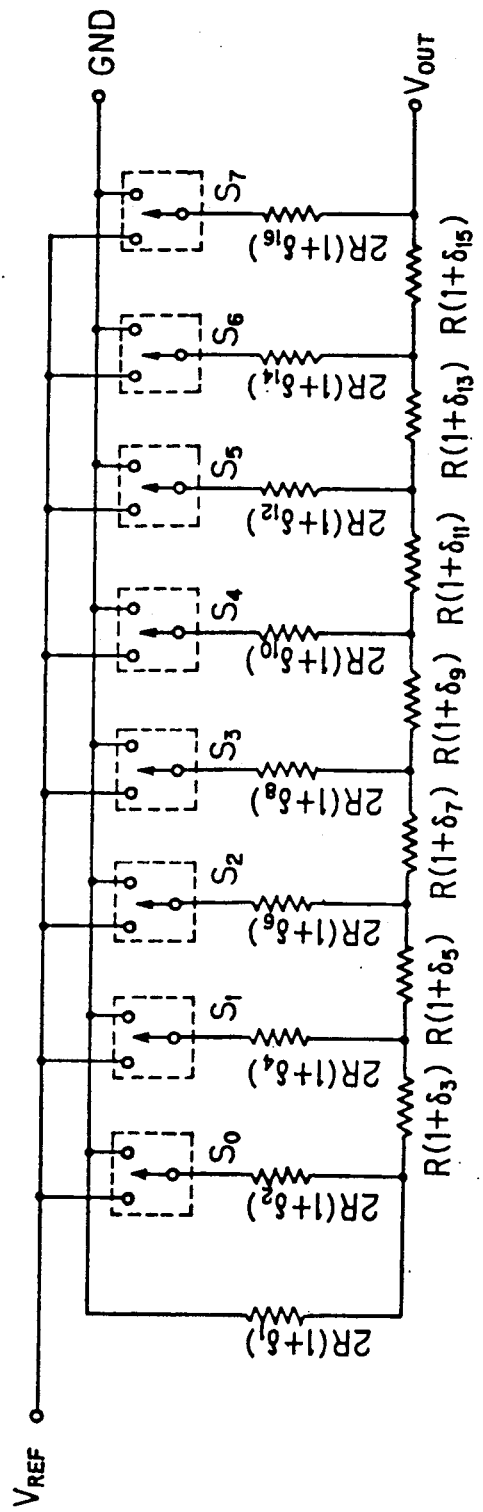
FIG. 3 is a circuit diagram showing a state in which resistances vary widely in a conventional circuit.
Figure 4:
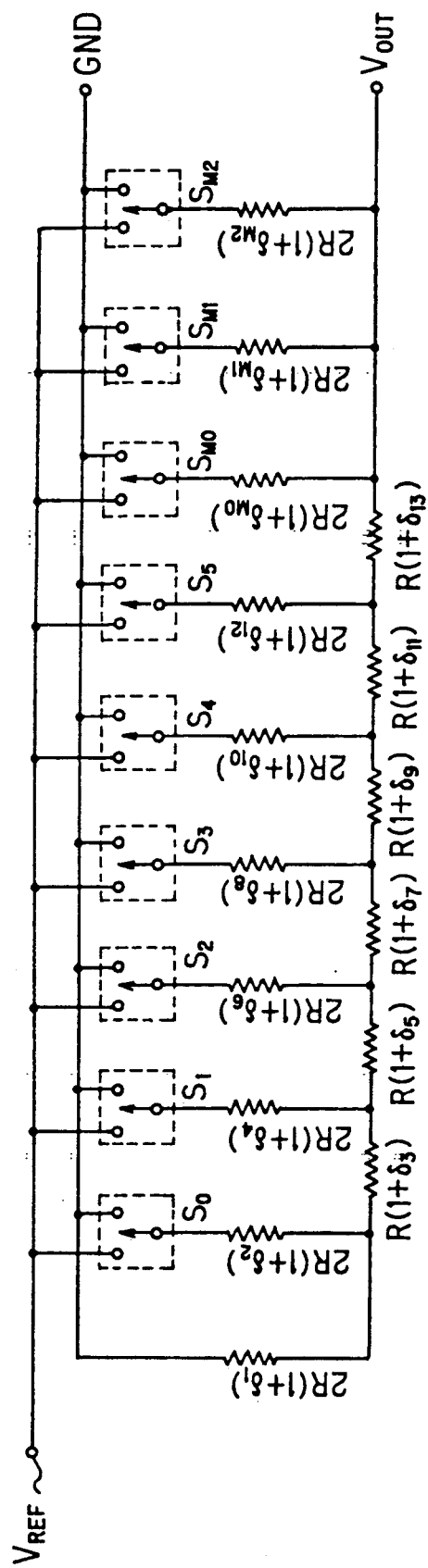
FIG. 4 is a circuit diagram showing a state in which the circuit of FIG. 1 has resistances varied widely.

Then, an improvement of a monotonicity by virtue of the digital/analog converter of the present invention will be described. FIG. 3 shows a state in which the conventional circuit in FIG. 11 has its resistances varied only by $(1+\delta)$ in the resistance values, R and 2R, while FIG. 4 shows a state in which a circuit of the embodiment according to the present invention in FIG. 1 has its resistances $R_1$ to $R_{13}$ and $R_{M0}$ to $R_{M2}$ varied only by $(1+\delta)$ in the resistance values, R and 2R.

A monotonicity of the conventional circuit in FIG. 3 is most easily impeded when the changeover switch $S_7$ having the largest weight changes the connection; that is, a state satisfying $b_7=0$, $b_6=b_5=b_4=b_3=b_2=b_1=b_0=1$ turns to a state satisfying $b_7=1$, $b_6=b_5=b_4=b_3=b_2=b_1=b_0=0$.

Figure 5:
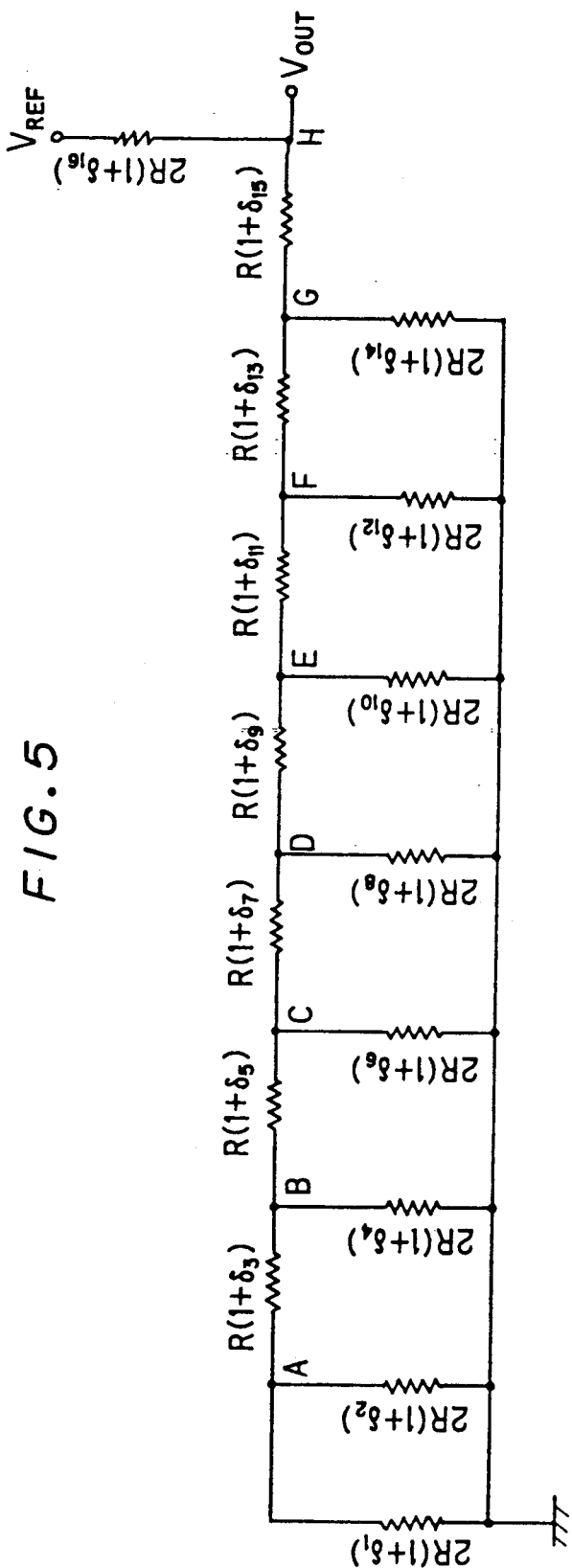

When the digital signals ($b_7$, $b_6$, $b_5$, $b_4$, $b_3$, $b_2$, $b_1$, $b_0$) is applied with (1, 0, 0, 0, 0, 0, 0, 0), the circuit in FIG. 3 is shown as that in FIG. 5.

An impedance $Z_A$ seen from a point A to the left is obtained as follows:

$$Z_A = \frac{2R(1+\delta_1) \times 2R(1+\delta_2)}{2R(1+\delta_1) + 2R(1+\delta_2)}$$

$$= \frac{2R(1+\delta_2+\delta_1+\delta_2\cdot\delta_1)}{2+\delta_2+\delta_1}$$

$$= \frac{2R(1+\delta_2+\delta_1+\delta_2\cdot\delta_1)}{2(1+\alpha)}$$

where $$\alpha = \frac{\delta_2+\delta_1}{2}.$$

Now, assuming that $\delta_2$, $\delta_1 \ll 1$ and terms of the second degree or more is neglected (Newton's linear approximation), $Z_A$ is obtained as follows:

$$Z_A = \frac{2R(1+\delta_2+\delta_1)}{2(1+\alpha)}$$

$$= R(1+\alpha)$$

Similarly, an impedance $Z_B$ seen from a point B to the left is obtained as follows:

$$Z_B = \frac{\{Z_A + R(1+\delta_3)\} \times 2R(1+\delta_4)}{Z_A + R(1+\delta_3) + 2R(1+\delta_4)}$$

$$= \frac{2R^2(1+\alpha+1+\delta_3)(1+\delta_4)}{R(1+\alpha+1+\delta_3+2+2\delta_4)}$$

$$= \frac{R\left(1 + \frac{\delta_3}{2} + \frac{\delta_2+\delta_1}{4}\right)(1+\delta_4)}{1 + \frac{\delta_4}{2} + \frac{\delta_3}{4} + \frac{\alpha}{4}}$$

$$= R\left(1 + \frac{\delta_4}{2} + \frac{\delta_3}{4} + \frac{\delta_2+\delta_1}{8}\right)$$

Similarly, an impedance $Z_C$ seen from a point C to the left is obtained as follows:

$$Z_C = R \cdot \left(1 + \frac{\delta_6}{2} + \frac{\delta_5}{4} + \frac{\delta_4}{8} + \frac{\delta_3}{16} + \frac{\delta_2+\delta_1}{32}\right)$$

With this equation, the impedance decreases initially by $\frac{1}{2}$ and then by $\frac{1}{4}$ as it goes to each less significant bit, for the resistance of resistance value 2R (the resistance between the contact point and the ground). On the other hand, the impedance decreases initially by $\frac{1}{4}$ and further by $\frac{1}{4}$ as it goes to each less significant bit, for the resistance of resistance value R (the resistance between the contact points).

Thus, an impedance $Z_G$ seen from a point G to the left is obtained as follows:

$$Z_G = R\left(1 + \frac{\delta_{14}}{2} + \frac{\delta_{13}}{2^2} + \frac{\delta_{12}}{2^3} + \frac{\delta_{11}}{2^4} + \right.$$

$$\frac{\delta_{10}}{2^5} + \frac{\delta_9}{2^6} + \frac{\delta_8}{2^7} + \frac{\delta_7}{2^8} + \frac{\delta_6}{2^9} +$$

$$\left.\frac{\delta_5}{2^{10}} + \frac{\delta_4}{2^{11}} + \frac{\delta_3}{2^{12}} + \frac{\delta_2+\delta_1}{2^{13}}\right)$$

-continued $$= R\left(1 + \sum_{i=2}^{14} \frac{\delta_{16-i}}{2^{i-1}} + \frac{\delta_1}{2^{13}}\right)$$

Thus, an impedance $Z_H$ seen from a point H to the left is obtained as follows:

$$Z_H = 2R\left(1 + \sum_{i=1}^{14} \frac{\delta_{16-i}}{2^i} + \frac{\delta_1}{2^{14}}\right)$$

Thus, the output voltage $V_{OUT}(1, 0, 0, 0, 0, 0, 0, 0)$ when the digital signal $(1, 0, 0, 0, 0, 0, 0, 0)$ was applied is obtained as follows:

$$V_{OUT}(1, 0, 0, 0, 0, 0, 0, 0) \quad (6)$$

$$= \frac{Z_H \cdot V_{REF}}{Z_H + 2R(1 + \delta_{16})}$$

$$= \frac{2R\left(1 + \sum_{i=1}^{14} \frac{\delta_{16-i}}{2^i} + \frac{\delta_i}{2^{14}}\right)}{2R\left(2 + \delta_{16} + \sum_{i=1}^{14} \frac{\delta_{16-i}}{2^i} + \frac{\delta_i}{2^{14}}\right)} \cdot V_{REF}$$

$$= \frac{V_{REF}}{2}\left(1 - \frac{\delta_{16}}{2} + \sum_{i=1}^{14} \frac{\delta_{16-i}}{2^{i+1}} + \frac{\delta_1}{2^{15}}\right)$$

Figure 6:
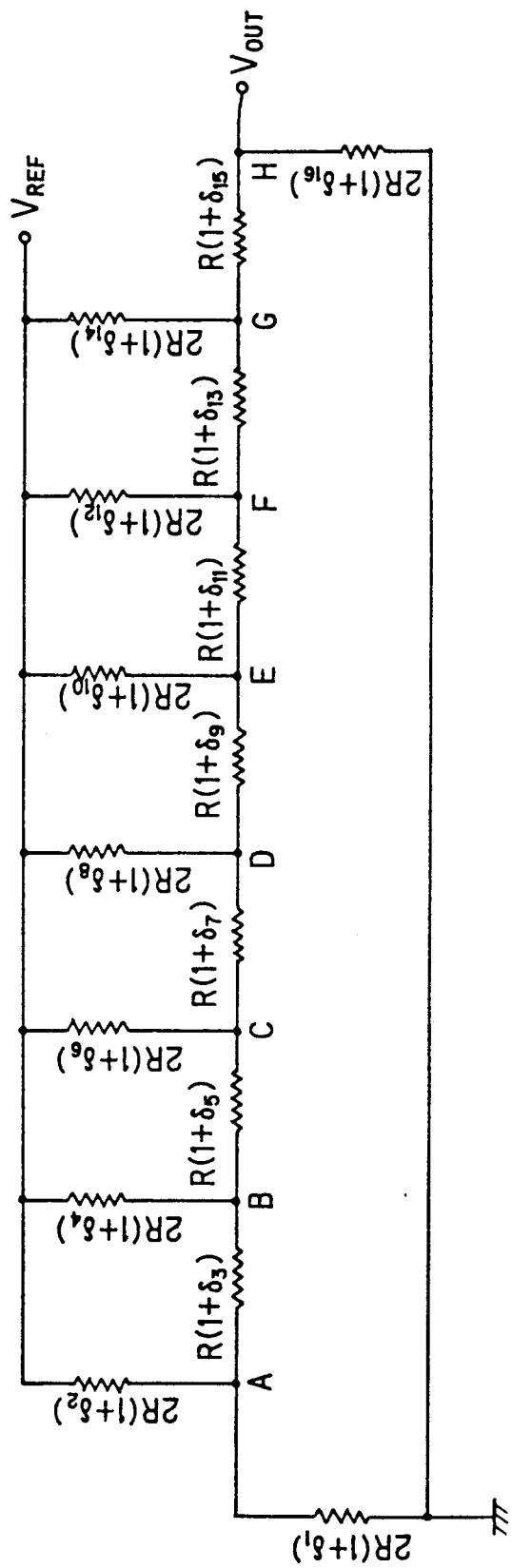

On the other hand, when the digital signal is applied with (0, 1, 1, 1, 1, 1, 1, 1), a circuit in FIG. 3 is shown as that in FIG. 6.

With the principle of superposition, an output voltage of the circuit in FIG. 6 is an output voltage $V_{OUT7}$ of a circuit in FIG. 7 subtracted by an output voltage $V_{OUT8}$ of a circuit in FIG. 8.

The output voltage $V_{OUT7}$ in FIG. 7 is obtained as follows:

$$V_{OUT7} = V_{REF} - V_{OUT}(1, 0, 0, 0, 0, 0, 0, 0)$$

The expression in the equation (6) is substituted for the $V_{OUT}(1, 0, 0, 0, 0, 0, 0, 0)$:

$$V_{OUT7} = \frac{V_{REF}}{2}\left(1 + \frac{\delta_{16}}{2} - \sum_{i=1}^{14} \frac{\delta_{16-i}}{2^{i+1}} - \frac{\delta_1}{2^{15}}\right) \quad (7)$$

The output voltage $V_{OUT8}$ in FIG. 8 is obtained as follows. In this case, a circuit in FIG. 8 is in a state where a resistance $2R(1+\delta_1)$ equivalent to 1 bit is connected to $V_{REF}$ as compared with a state where resistances $2R(1+\delta_i)$ (i=1, 2, 4, 6, 8, 10, 12, 14, 16) are grounded.

$$V_{OUT8} = \frac{1}{2^8}(1 + \delta_{error}) \cdot V_{REF} \quad (8)$$

where $\delta_{error}$ is an error component caused by $\delta_0$ to $\delta_{15}$.

Thus, an output voltage of the circuit in FIG. 6, or the output voltage $V_{OUT}(0, 1, 1, 1, 1, 1, 1, 1)$ when the digital signal is applied with (0, 1, 1, 1, 1, 1, 1, 1), can be expressed, using the above equations (7) and (8), as follows:

$$V_{OUT}(0, 1, 1, 1, 1, 1, 1, 1) \quad (9)$$
$$= V_{OUT7} - V_{OUT8}$$

$$= \frac{V_{REF}}{2}\left(1 + \frac{\delta_{16}}{2} - \sum_{i=1}^{14} \frac{\delta_{16-i}}{2^{i+1}} - \frac{\delta_1}{2^{15}} - \frac{1}{2^7} - \frac{1}{2^7}\delta_{error}\right)$$

Then, a difference voltage $\Delta V_{OUT}$ between $V_{OUT}(1, 0, 0, 0, 0, 0, 0, 0)$ and $V_{OUT}(0, 1, 1, 1, 1, 1, 1, 1)$ is obtained, using the above equations (6) and (9), as follows:

$$\Delta V_{OUT}$$
$$= V_{OUT}(1, 0, 0, 0, 0, 0, 0, 0) - V_{OUT}(0, 1, 1, 1, 1, 1, 1, 1)$$

$$= \frac{V_{REF}}{2^8}\left(1 - 2^7 \cdot \delta_{16} + \sum_{i=1}^{14} \frac{\delta_{16-i}}{2^{i-7}} + \frac{\delta_1}{2^7}\delta_{error}\right)$$

The $\delta_{error}$ is negligible because it is a very small value, and can be expressed as follows:

$$\Delta V_{OUT} \quad (10)$$

$$\simeq \frac{V_{REF}}{2^8}\left(1 - 2^7 \cdot \delta_{16} + \sum_{i=1}^{14} \frac{\delta_{16-i}}{2^{i-7}} + \frac{\delta_1}{2^7}\right)$$

$$= \frac{V_{REF}}{2}\left(\frac{1}{2^7} - \delta_{16} + \sum_{i=1}^{14} \frac{\delta_{16-i}}{2^i} + \frac{\delta_1}{2^{14}}\right)$$

The equation (10) shows an amount of a variation in the output voltage $V_{OUT}$ when the digital signal is altered from (0, 1, 1, 1, 1, 1, 1, 1) to (1, 0, 0, 0, 0, 0, 0, 0), and in the case where the conventional circuit in FIG. 3 is used, its monotonicity is impeded when $\delta_{16}$ is $\frac{1}{2}^7$ or more.

Meanwhile, in a circuit of an embodiment according to the present invention shown in FIG. 4, its monotonicity is impeded most when the changeover switches $S_{M0}$, $S_{M1}$, $S_{M2}$ having the largest weight change their respective connections as in three cases below:

(1) A state where $b_{M2}=0$, $b_{M1}=0$, $b_{M0}=0$, $b_5=b_4=b_3=b_2=b_1=1$ are satisified is changed into a state where $b_{M2}=0$, $b_{M1}=0$, $b_{M0}=1$, $b_5=b_4=b_3=b_2=b_1=b_0=0$ are satisfied.

(2) A state where $b_{M2}=0$, $b_{M1}=0$, $b_{M0}=1$, $b_5=b_4=b_3=b_2=b_1=1$ are satisified is changed into a state where $b_{M2}=0$, $b_{M1}=1$, $b_{M0}=1$, $b_5=b_4=b_3=b_2=b_1=b_0=0$ are satisfied.

(3) A state where $b_{M2}=0$, $b_{M1}=1$, $b_{M0}=1$, $b_5=b_4=b_3=b_2=b_1=b_0=1$ are satisfied is changed into a state where $b_{M2}=1$, $b_{M1}=1$, $b_{M0}=1$, $b_5=b_4=b_3=b_2=b_1=b_0=0$ are satisfied.

An amount of a variation in the output voltage $V_{OUT}$ in these cases is obtained in the same way as employed for the conventional circuit in FIG. 3, as follows:

In the case of (1):

In the case of (1):
$$\Delta V_{OUT} \quad (11)$$

$$= \frac{V_{REF}}{4} \cdot \left(1 \cdot 2^6 - \delta_{M0} + \sum_{i=1}^{12} \frac{\delta_{14-i}}{2^i} + \frac{\delta_1}{2^{12}}\right)$$

In the case of (2):
$$\Delta V_{OUT} \quad (2)$$

-continued $$= \frac{V_{REF}}{4} \cdot \left(1 \cdot 2^6 - \delta_{M1} + \sum_{i=1}^{12} \frac{\delta_{14-i}}{2^i} + \frac{\delta_1}{2^{12}}\right)$$

In the case of (3):
$$\Delta V_{OUT} \tag{11}$$

$$= \frac{V_{REF}}{4} \cdot \left(1 \cdot 2^7 - \delta_{M2} + \sum_{i=1}^{12} \frac{\delta_{14-i}}{2^i} + \frac{\delta_1}{2^{12}}\right)$$

As will be recognized from the above equations (11), (12) and (13), in the circuit of the embodiment according to the present invention, a monotonicity is impeded when $\delta_{M0}$, $\delta_{M1}$ and $\delta_{M2}$ are $\frac{1}{2}^6$ or more.

In other words, it will be recognized that the circuit of the embodiment according to the present invention in FIG. 4 requires the matching of resistors in a half degree varied to a range of to that of the conventional circuit in FIG. 3, so as to maintain its monotonicity, compared with the conventional circuit in FIG. 3.

Figure 11:
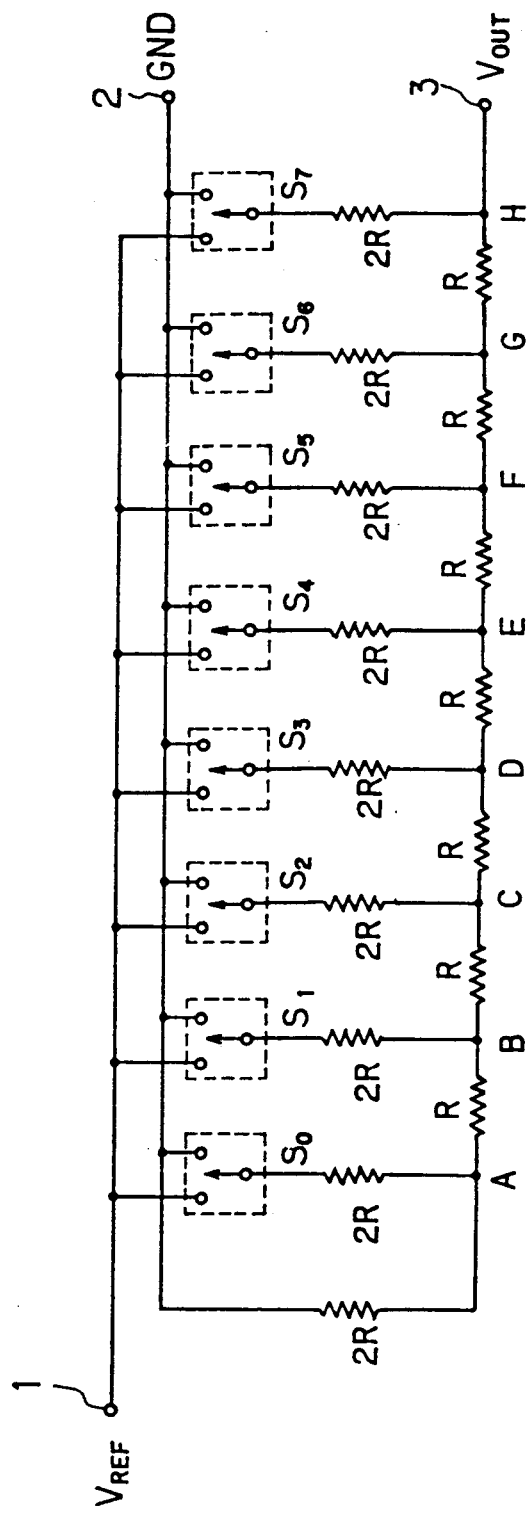
FIG. 11 is a circuit diagram showing a conventional 8 bit digital/analog converter.

In this way, it is easy to maintain a monotonicity in a circuit of the embodiment according to the present invention shown in FIG. 1, and this is because an amount of a variation in the output voltage $V_{OUT}$ caused by a changeover of the changeover switch $S_7$ is $2^7$ times as large as that caused by a changeover of the changeover switch $S_0$ in the circuit in FIG. 11, while an amount of variation in the output voltage $V_{OUT}$ caused by a changeover of each of the changeover switches $S_{M0}$, $S_{M1}$ and $S_{M2}$ is only $2^6$ times as large as that caused by a changeover of the changeover switch $S_0$.

Thus, the first digital/analog converting circuit 4 has a specified number of changeover switchs $S_0$ to $S_5$ and the same number of resistances $R_2$ to $R_{13}$ corresponding to the number of low order bits, while the second digital/analog converting circuit 5 has more changeover switches $S_{M0}$ to $S_{M2}$ and $R_{M0}$ to $R_{M2}$ than the number of high order bits, so that the monotonicity can be maintained without enhancing a matching of resistors.

A case in which an 8 bit digital signal is converted into an analog signal has been described. In general, when a digital signal consisting of $N_L$ low-order bits and $N_U$ high-order bits is converted into an analog signal, the circuit in FIG. 1 may be provided with the first switch group 7 consisting of $N_L$ changeover switches and the R-2R circuit 6 including the same number of R- and 2R-resistances, and may be further provided with the second switch group 9 consisting of $(2^N-1)$ changeover switches and the 2R circuit 8 including the same number of 2R-resistances. Each of the changeover switches of the first switch group 7 may change its connection to the reference voltage $V_{REF}$ or the ground potential GND in accordance with a state of corresponding bit of the low-order bits, and the number of the changeover switches of the second switch group 9 which change the connections to the reference voltage $V_{REF}$ is determined in accordance with a state of the high-order bits.

Figure 9:
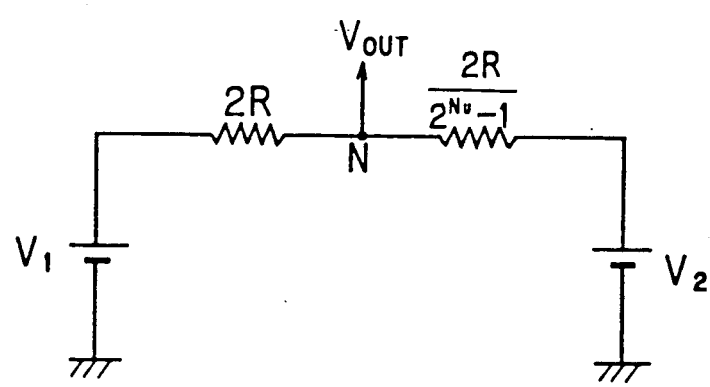
FIG. 9 is a diagram showing an equivalent circuit diagram of a digital/analog converter represented through generalization.

Thus, when the digital signal is generally represented by the low-order $N_L$ bits and the high-order $N_U$ bits, a digital/analog circuit equivalent to that shown in FIG. 2 is shown as a circuit in FIG. 9. A point N in FIG. 9 corresponds to a junction of the first and second digital/analog converting circuits 4 and 5, while $V_1$ and $V_2$ denote voltages when the first and second digital/analog converting circuits 4 and 5 are seen from the point N, respectively.

The $V_1$ and $V_2$ are expressed as follows:

$$V_1 = \frac{\sum_{i=0}^{N_L-1} b_i \cdot 2^i}{2^{N_L}} \cdot V_{REF}$$

$$V_2 = \frac{\sum_{j=0}^{2^{N_U}-2} b_{Mj}}{2^{N_U} - 1} \cdot V_{REF}$$

Thus, the output voltage $V_{OUT}$ is expressed as follows:

$$V_{OUT} = \frac{\frac{\sum_{i=0}^{N_L-1} b_i \cdot 2^i}{2^{N_L}} V_{REF} \cdot \frac{2R}{2^{N_U}-1} + \frac{\sum_{j=0}^{2^{N_U}-2} b_{Mj}}{2^{N_U}-1} V_{REF} \cdot 2R}{2R + \frac{2R}{2^{N_U}-1}} \tag{14}$$

$$= \frac{\sum_{i=0}^{N_L-1} b_i \cdot 2^i + 2^{N_L} \sum_{j=0}^{2^{N_U}-2} b_{Mj}}{2^{N_L+N_U}} V_{REF}$$

Figure 10:
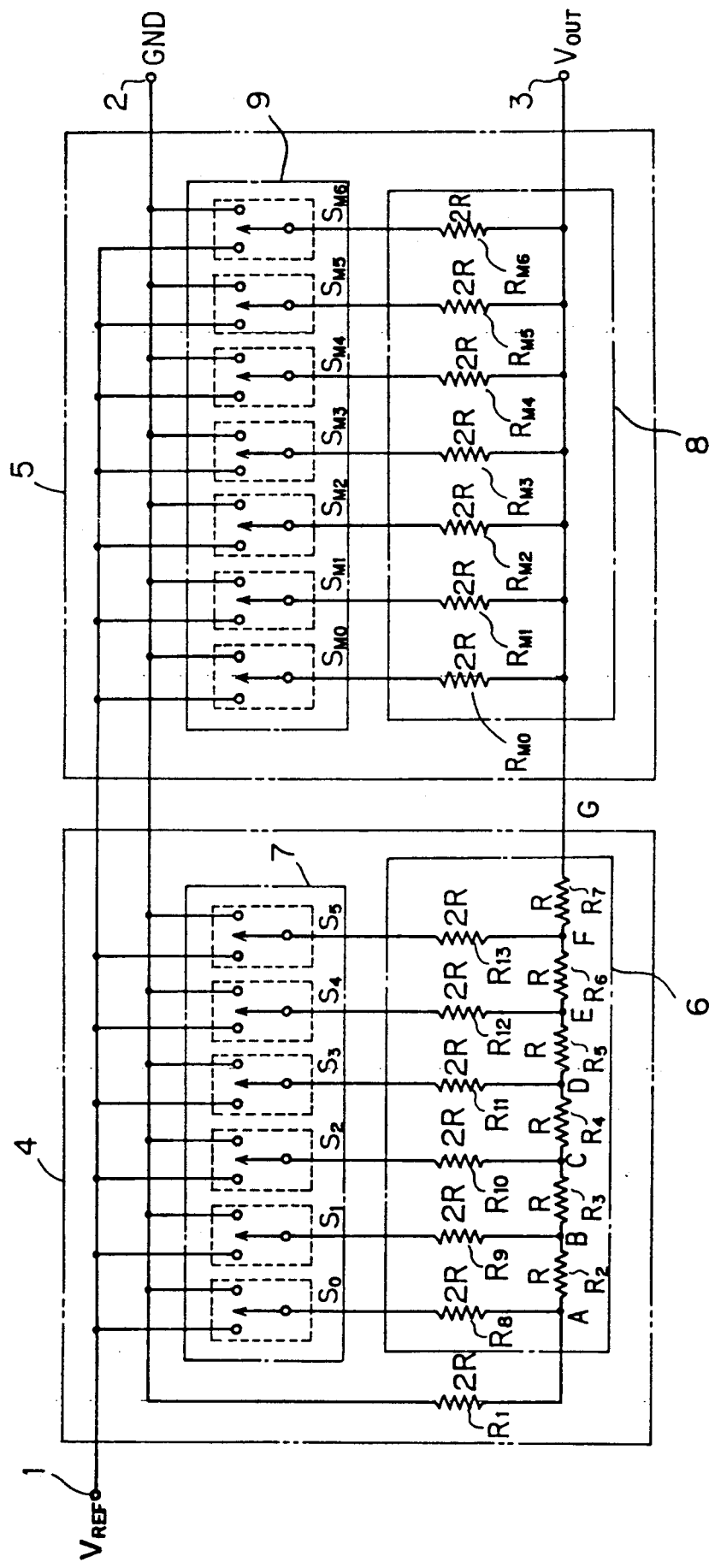
FIG. 10 is a circuit diagram showing another embodiment of a 9 bit digital/analog converter according to the present invention.

For a reference, a digital/analog converter for converting a 9 bit digital signal into an analog signal is shown in FIG. 10, where $N_L$ which is the number of the low-order bits is set "6" and $N_U$ which is the number of the high-order bits is set "3". In this case, the number of the changeover switches and that of the resistances provided in the second digital/analog converting circuit 5 are calculated as follows:

$$2^{N_u} - 1 = 2^3 - 1 = 7$$

Thus, there are seven of the changeover switches $S_{M0}$ to $S_{M6}$ and seven of the resistances $R_{M0} \sim R_{M6}$ in the second digital/analog converting circuit 5.

The changeover switches $S_{M0}$ to $S_{M6}$ of the second switch group 9 change their respective connections in accordance with the state of the high-order 3 bits, as shown in a table below.

| $B_6$ | $B_7$ | $B_8$ | $S_{M0}$ | $S_{M1}$ | $S_{M2}$ | $S_{M3}$ | $S_{M4}$ | $S_{M5}$ | $S_{M6}$ |
|---|---|---|---|---|---|---|---|---|---|
| 0 | 0 | 0 | GND | GND | GND | GND | GND | GND | GND |
| 1 | 0 | 0 | $V_{REF}$ | GND | GND | GND | GND | GND | GND |
| 0 | 1 | 0 | $V_{REF}$ | $V_{REF}$ | GND | GND | GND | GND | GND |
| 1 | 1 | 0 | $V_{REF}$ | $V_{REF}$ | $V_{REF}$ | GND | GND | GND | GND |

-continued

| $B_6$ | $B_7$ | $B_8$ | $S_{M0}$ | $S_{M1}$ | $S_{M2}$ | $S_{M3}$ | $S_{M4}$ | $S_{M5}$ | $S_{M6}$ |
|---|---|---|---|---|---|---|---|---|---|
| 0 | 0 | 1 | $V_{REF}$ | $V_{REF}$ | $V_{REF}$ | $V_{REF}$ | GND | GND | GND |
| 1 | 0 | 1 | $V_{REF}$ | $V_{REF}$ | $V_{REF}$ | $V_{REF}$ | $V_{REF}$ | GND | GND |
| 0 | 1 | 1 | $V_{REF}$ | $V_{REF}$ | $V_{REF}$ | $V_{REF}$ | $V_{REF}$ | $V_{REF}$ | GND |
| 1 | 1 | 1 | $V_{REF}$ | $V_{REF}$ | $V_{REF}$ | $V_{REF}$ | $V_{REF}$ | $V_{REF}$ | $V_{REF}$ |

In the above table, $B_6$, $B_7$ and $B_8$ denote the high-order 3 bits. GND represents that the changeover switches $S_{M0}$ to $S_{M6}$ change their respective connections to the ground potential GND, while $V_{REF}$ represents that they change their respective connections to the reference voltage $V_{REF}$.

The output voltage $V_{OUT}$ of the digital/analog converter is expressed, substituting $N_L=6$ and $N_U=3$ for the corresponding character elements in the equation (14), as follows:

$$V_{OUT} = \frac{V_{REF}}{2^9} \{b_0 + 2 \cdot b_1 + 2^2 \cdot b_2 + 2^3 \cdot b_3 + 2^4 \cdot b_4 + 2^5 \cdot b_5 + 2^6(b_{M0} + b_{M1} + b_{M2} + b_{M3} + b_{M4} + b_{M5} + b_{M6})\}$$

The digital/analog converter attains the same effect as the above-mentioned embodiment.

In the above embodiment, although the reference voltage $V_{REF}$ is applied to the first input terminal 1 while the ground potential GND is applied to the second input terminal 2, the present invention does not limit the voltage applied to the first and second input terminals 1 and 2 to the aforementioned voltage; first and second reference potentials of mutually different values have only to be applied to the first and second input terminals 1 and 2, respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital/analog converter which converts a digital signal of a binary number consisting of $N_L$ low-order bits and $N_U$ high-order bits into an analog signal, comprising:

a first input terminal to which first reference potential is applied;

a second input terminal to which second reference potential is applied;

an output terminal;

a first digital/analog converting circuit driven in accordance with a digital data of said low-order bits; and a second digital/analog converting circuit driven in accordance with a digital data of said high-order bits;

said first digital/analog converting circuit including:

a first resistor of resistance value 2R having its one end connected to said second input terminal;

R-2R circuitry which includes $N_L$ second resistors of resistance value R connected in series and $N_L$ third resistors of resistance value 2R having their respective one ends connected to one ends of said second resistors; a junction of the one end of said second resistor and the one end of said third resistor disposed on one side being connected to the other end of said first resistor, and the other end of said second resistor disposed on the other side being connected to said output terminal; and a first switch group which consists of $N_L$ first changeover switches having their respective first and second changeover contact points and common contact points; in each of said first changeover switches, said first changeover contact point being connected to said first input terminal, said second changeover contact point being connected to said second input terminal and said common contact point being connected to the other end of said corresponding third resistor, and each of said first changeover switches changing its connection between said first and second changeover contact points in accordance with a state of each bit of said low-order bits;

said second digital/analog converting circuit including:

2R circuitry which consists of $(2^N-1)$ fourth resistors of resistance value 2R having their respective one ends commonly connected and having said one ends connected to said output terminal; and a second switch group which consists of $(2^N-1)$ second changeover switches having their respective first and second changeover contact points and common contact points; in each of said second changeover switches, said first changeover contact point being connected to said first input terminal, said second changeover contact point being connected to said second input terminal and said common contact point being connected to the other end of said corresponding fourth resistor, and the number of said second changeover switches changing their respective connections to said first changeover contact points being determined in accordance with a state of said high-order bits.

2. A digital/analog converter according to claim 1, wherein the number $N_L$ of said low-order bits is 6, while the number $N_U$ of said high-order bits is 2.

3. A digital/analog converter according to claim 1, wherein the number $N_L$ of said low-order bits is 6, while the number $N_U$ of said high-order bits is 3.

4. A digital/analog converter according to claim 1, wherein said first reference potential is reference voltage $V_{REF}$ having a specified positive voltage, while said second reference potential is ground potential.

* * * * *